United States Patent
Li

(10) Patent No.: US 9,006,719 B2
(45) Date of Patent: Apr. 14, 2015

(54) OLED PIXEL STRUCTURE AND OLED PANEL EACH HAVING THREE COLORED LIGHT EMITTING ZONES ARRANGED IN PARALLEL

(71) Applicant: Shenzhen China Star Optoelectronics Technology Co., Ltd, Shenzhen (CN)

(72) Inventor: Chunhuai Li, Shenzhen (CN)

( * ) Notice: Subject to any disclaimer, the term of this patent is extended or adjusted under 35 U.S.C. 154(b) by 18 days.

(21) Appl. No.: 13/821,241

(22) PCT Filed: Jan. 17, 2013

(86) PCT No.: PCT/CN2013/070588
§ 371 (c)(1),
(2) Date: Mar. 7, 2013

(87) PCT Pub. No.: WO2014/110751
PCT Pub. Date: Jul. 24, 2014

(65) Prior Publication Data
US 2014/0197379 A1    Jul. 17, 2014

(30) Foreign Application Priority Data
Jan. 16, 2013   (CN) .......................... 2013 1 0015904

(51) Int. Cl.
| | |
|---|---|
| H01L 29/08 | (2006.01) |
| H01L 35/24 | (2006.01) |
| H01L 51/00 | (2006.01) |
| H01L 51/52 | (2006.01) |
| H01L 27/32 | (2006.01) |
| H01L 29/04 | (2006.01) |
| H01L 29/10 | (2006.01) |
| H01L 31/00 | (2006.01) |
| H01L 27/14 | (2006.01) |
| H01L 29/15 | (2006.01) |

(52) U.S. Cl.
CPC ........ *H01L 51/5262* (2013.01); *H01L 27/3241* (2013.01)

(58) Field of Classification Search
None
See application file for complete search history.

(56) References Cited

U.S. PATENT DOCUMENTS

| | | | |
|---|---|---|---|
| 8,022,900 B2 * | 9/2011 | Koh et al. | ........................ 345/76 |
| 2009/0058294 A1 | 3/2009 | Joo et al. | |
| 2009/0140253 A1 * | 6/2009 | Kasahara | ........................ 257/59 |
| 2009/0140648 A1 * | 6/2009 | Tohyama et al. | ............. 313/505 |

FOREIGN PATENT DOCUMENTS

| | | |
|---|---|---|
| CN | 1638571 A | 7/2005 |
| CN | 101051648 A | 10/2007 |

(Continued)

OTHER PUBLICATIONS

Xi Wanhua, the International Searching Authority written comments, Oct. 2013, CN.

*Primary Examiner* — Michael Jung

(57) ABSTRACT

The present disclosure provides an organic light emitting diode (OLED) pixel structure and an OLED panel. The pixel structure comprises a plurality of colored light emitting zones arranged in parallel. The colored light emitting zone of each color is divided into a second zone, a first zone, and a third zone. A distance is set between the second zone and the first zone, and a distance is set between the second zone and the third zone. Anodes of the first zone, the second zone, and the third zone are connected with a first reference voltage by a thin film transistor (TFT), a cathode of the second zone is connected to a second reference voltage, a cathode of the first zone is connected to a first interface, and a cathode of the third zone is connected to a second interface.

6 Claims, 4 Drawing Sheets

(56) References Cited

FOREIGN PATENT DOCUMENTS

| CN | 101894860 A | 11/2010 |
| CN | 102354701 A | 2/2012 |
| CN | 202183373 U | 4/2012 |
| JP | 2007-17478 A | 1/2007 |

* cited by examiner

US 9,006,719 B2

OLED PIXEL STRUCTURE AND OLED PANEL EACH HAVING THREE COLORED LIGHT EMITTING ZONES ARRANGED IN PARALLEL

TECHNICAL FIELD

The present disclosure relates to the display field, and more particularly to an organic light emitting diode (OLED) pixel structure and an OLED panel.

BACKGROUND

AMOLED refers to an active matrix/organic light emitting diode (AMOLED) panel, hereinafter an OLED panel for short. The OLED panel includes a substrate. In a prior art, organic material is deposited on the substrate by a vapor plating method to form a light emitting zone. In a current method, a red light emitting zone, a green light emitting zone, and a blue light emitting zone are successively deposited on an OLED substrate by vapor plating mask. As shown in FIG. 1, a red (R) pixel indium tin oxide (ITO), a green (G) ITO, a blue (B) ITO and a than film transistor (TFT) pixel circuit are horizontally arranged in parallel. Because a sum of a manufacturing error of the vapor plating mask itself and an alignment error of the vapor plating mask and the substrate is generally 15 μm, color mixing is easy to occur in a colored light emitting zone. To avoid color mixing, a distance D0 between two colored light emitting zones of different colors is required to be at least 30 μm. Such design greatly affects an aperture ratio of the pixel of the OLED panel. The aperture ratio refers to a ratio of an effective light emitting area of the colored light emitting zone in each pixel to an entire area of each pixel.

SUMMARY

In view of the above-described problems, the aim of the present disclosure is to provide an organic light emitting diode (OLED) pixel structure and an OLED panel capable of increasing an aperture ratio of the pixel of the OLED panel.

A first technical scheme of the present disclosure is that: an OLED panel comprises a substrate, and a pixel deposited on the substrate by as vapor plating method. The pixel comprises a plurality of colored light emitting zones arranged in parallel. The colored light emitting zone of each color is divided into a second zone, a first zone, and a third zone. A distance is set between the second zone and the first zone, and a distance is set between the second zone and the third zone. Anodes of the first zone, the second zone, and the third zone are connected with a first reference voltage by a thin film transistor (TFT), a cathode of the first zone is connected to a first interface, a cathode of the second zone is connected to a second reference voltage, and a cathode of the third zone is connected to a second interface. When color mixing occurs in the first zone, the first interface is connected with the first reference voltage, and there is no color mixing in the first zone, the first interface is connected with the second reference voltage. When color mixing occurs in the third zone, the second interface is connected with the first reference voltage, and there is no color mixing in the third zone, the second interface is connected with the second reference voltage. The OLED panel further comprises a multiplexer. The first interface and the second interface are selectively connected with the first reference voltage or the second reference voltage by the multiplexer. Both the distance between the second zone and the first zone, and the distance between the second zone and the third zone are D1, D1=3 μm. A distance between two adjacent colored light emitting zones of different colors is D2, D2=5 μm.

A second technical scheme of the present disclosure is that: an OLED pixel structure comprises a plurality of colored light emitting zones arranged in parallel. The colored light emitting zone of each color is divided into a second zone, a first zone, and a third zone. A distance is set between the second zone and the first zone, and a distance is set between the second zone and the third zone. Anodes of the first zone, the second zone, and the third zone are connected with a first reference voltage by a TFT, a cathode of the second zone is connected to a second reference voltage, a cathode of the first zone is connected to a first interface, and a cathode of the third zone is connected to a second interface.

In one example, both a width of the first zone and a width of the third zone are H, 5 μm≤H≤9.5 μm.

In one example, both the distance between the second zone and the first zone, and the distance between the second zone and the third zone are D1, 3 μm≤D1≤5 μm.

In one example, a distance between two adjacent colored light emitting zones of different colors is D2, 5 μm≤D2≤10 μm.

A third technical scheme of the present disclosure is that: an OLED panel comprises a substrate, and a pixel deposited on the substrate by a vapor plating method. The pixel comprises a plurality of colored light emitting zones arranged in parallel. The colored light emitting zone of each color is divided into a second zone, a first zone, and a third zone. A distance is set between the second zone and the first zone, and a distance is set between the second zone and the third zone. Anodes of the first zone, the second zone, and the third zone are connected with a first reference voltage by a TFT, a cathode of the first zone is connected to a first interface, a cathode of the second zone is connected to a second reference voltage, and a cathode of the third zone is connected to a second interface. When color mixing occurs in the first zone, the first interface is connected with the first reference voltage, and there is no color mixing in the first zone, the first interface is connected with the second reference voltage. When color mixing occurs in the third zone, the second interface is connected with the first reference voltage, and there is no color mixing in the third zone, the second interface is connected with the second reference voltage.

In one example, the OLED panel further comprises a multiplexer. The first interface and the second interface are selectively connected with the first reference voltage or the second reference voltage by the multiplexer.

In one example, both a width of the first zone and a width of the third zone are H, 5 μm≤H≤9.5 μm.

In one example, both the distance between the second zone and the first zone, and the distance between the second zone and the third zone are D1, 3 μm≤D1≤5 μm.

In one example, a distance between two adjacent colored light emitting zones of different colors is D2, 5 μm≤D2≤10 μm.

In one example, both the distance between the second zone and the first zone, and the distance between the second zone and the third zone are D1, D1=3 μm, and the distance between two adjacent colored light emitting zones of different colors is D2, D2=5 μm.

Advantages of the present disclosure are summarized below: the colored light emitting zone of each color is divided, and the distance between two adjacent colored emitting zones of different colors is reduced. Because a distance between the second zones of the colored emitting zones of different colors is large, color mixing may not occur. Color mixing occurs in the first zone or the third zone. The anode of the second zone is connected with the first reference voltage by the TFT, and the cathode of the second zone is connected to the second reference voltage so that normal operation may be performed in the second zone all the time. When color mixing occurs neither in the first zone nor in the third zone, the first interface and the second interface are connected with the second reference voltage, so that normal operation may be performed in the first zone and the third zone.

When color mixing occurs in the first zone, the first interface is connected with the first reference voltage, no current passes through an electrode connected with the first zone, and the first zone may not emit light. Similarly, when color mixing occurs in the third zone, the second interface is connected with the first reference voltage, no current passes through an electrode connected with the third zone, and the third zone may not emit light, thereby ensuring the pixel to have high color purity. Because the vapor plating mask generally deflects leftward or rightward during alignment, color mixing occurs in at most one zone of the first zone or the third zone, thereby increasing an aperture ratio of the pixel of the OLED panel.

DETAILED DESCRIPTION

The present disclosure provides an organic light emitting diode (OLED) pixel structure and an OLED panel. The OLED panel comprises a substrate and a pixel deposited on the substrate by a vapor plating method. FIG. 2-FIG. 5 show an example of the pixel structure of the present disclosure, where VDD represents a first reference voltage, VSS represents a second reference voltage, P1 represents a first interface, and P2 represents a second interface. The pixel comprise a plurality of colored light emitting zones arranged in parallel, specifically red (R), green (G), and blue (B) in the example. The colored light emitting zone of each color is divided into a second zone 2, a first zone 1, and a third zone 3. A distance is set between the second zone 2 and the first zone 1, and a distance is set between the second zone 2 and the third zone 3. Anodes of the first zone 1, the second zone 2, and the thud zone 3 are connected with the first reference voltage (VDD) by a thin film transistor (TFT), a cathode of the first zone 1 is connected to the first interface (P1), a cathode of the second zone 2 is connected to the second reference voltage (VSS), and a cathode of the third zone 3 is connected to the second interface (P2). When color mixing occurs in the first zone 1, the first interface (P1) is connected with the first reference voltage (VDD), and there is no color mixing in the first zone 1, the first interface (P1) is connected with the second reference voltage (VSS). When color mixing occurs in the third zone 3, the second interface (P2) is connected with the first reference voltage (VDD), and there is no color mixing in the third zone 3, the second interface (P2) connected with the second reference voltage (VSS).

Figure 1:
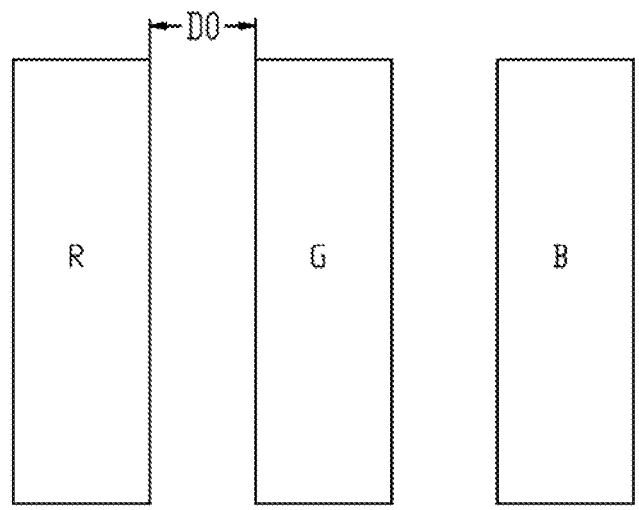
FIG. 1 is a structural diagram of a pixel in the prior art.
Figure 2:
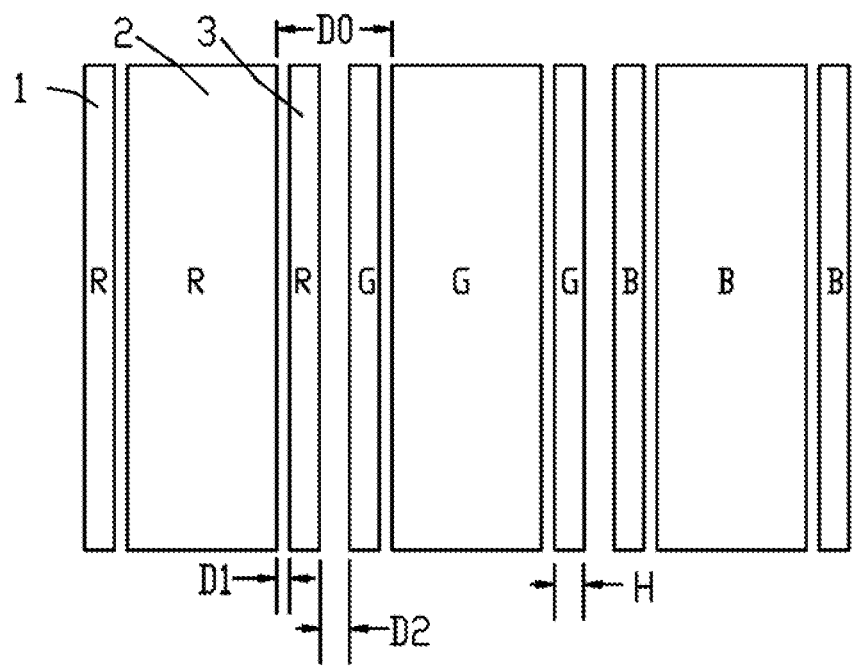
FIG. 2 is a structural diagram of an example of a pixel of the present disclosure.
Figure 3:
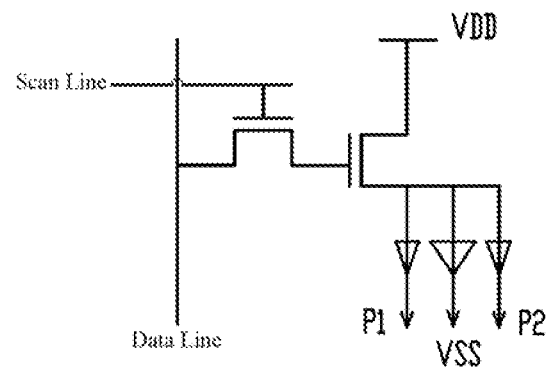
FIG. 3 is a line diagram of a pixel of the present disclosure.
Figure 4:
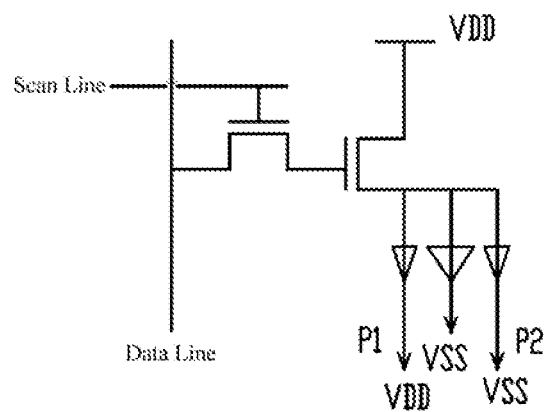
FIG. 4 is a line diagram of a first interface and a first reference voltage which are connected when color mixing occurs in a first zone of a colored light emitting zone.
Figure 5:
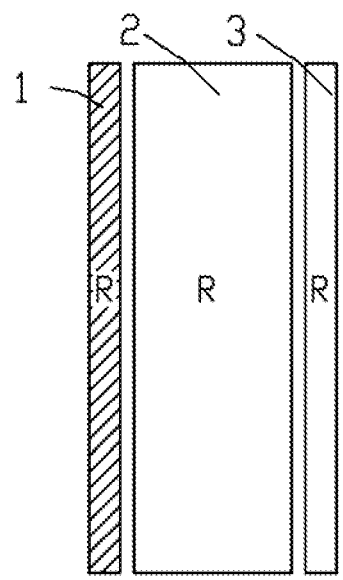
FIG. 5 is a structural diagram of a pixel when a first zone does not emit light by taking a red light emitting zone as an example.
Figure 6:
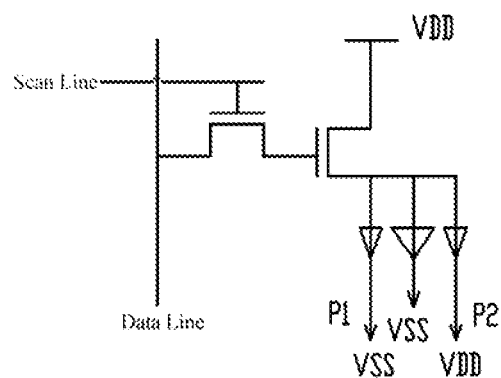
FIG. 6 is a line diagram of a second interface and a first reference voltage which are connected when color mixing occurs in a third zone of a colored light emitting zone.
Figure 7:
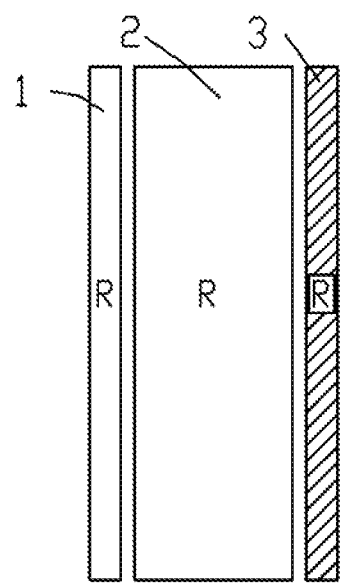
FIG. 7 is a structural diagram of a pixel when a third zone does not emit light by taking a red light emitting zone as an example.

As shown in FIG. 4, take a red light emitting zone as an example, when color mixing occurs in the first zone 1, the first interface (P1) is connected with the first reference voltage (VDD), and there is no color mixing in the first zone 1, the first interface (P1) is connected with the second reference voltage (VSS). As shown in FIG. 6, when color mixing occurs in the third zone 3, the second interface (P2) is connected with the first reference voltage (VDD), and there is no color mixing in the third zone 3, the second interface (P2) is connected with the second reference voltage (VSS).

Figure 8:
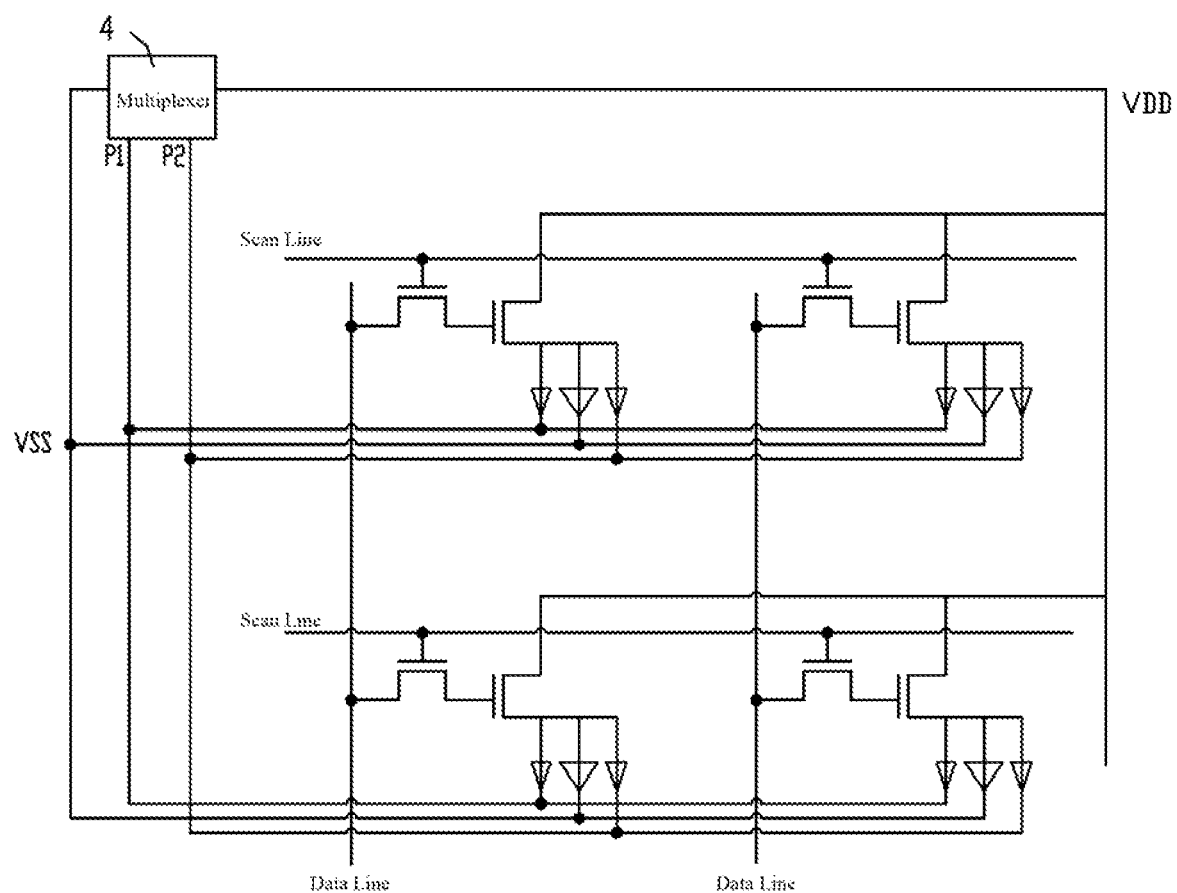
FIG. 8 is a line diagram of a red light emitting zone in a pixel of a 2*2 array of the present disclosure.

FIG. 8 is a line diagram of the red light emitting zone in a pixel of a 2*2 array. The OLED panel comprises a multiplexer 4, where the first interface (P1) and the second interface (P2) are selectively connected with the first reference voltage (VDD) or the second reference voltage (VSS) by the multiplexer 4. By using the multiplexer, the first interface (P1) and the second interface (P2) are switched between the first reference voltage (VDD) and the second reference voltage (VSS).

In the present disclosure, the colored light emitting zone of each color is divided, and a distance D2 between every two adjacent colored emitting zones of different colors is reduced. Because a distance between the second zones of the colored light emitting zones of different colors is large, generally more than 30 μm, and a distance between the second zone of the red light emitting zone and the first zone of the green light emitting zone is more than 15 μm in general, color mixing may not occur in the second zones of the colored light emitting zones of all colors. Color mixing occurs in the first zone or the third zone. The anode of the second zone is connected with the first reference voltage (VDD) by the TFT, and the cathode of the second zone is connected to the second reference voltage (VSS) so that normal operation may be performed in the second zone all the time. When color mixing occurs neither in the first zone nor in the third zone, the first interface (P1) and the second interface (P2) are connected with the second reference voltage (VSS), so that normal operation may be performed in both the first zone and the third zone.

When color mixing occurs in the first zone, the first interface (P1) is connected with the first reference voltage (VDD), no current passes through an electrode connected with the first zone, and the first zone may not emit light. Similarly, when color mixing occurs in the third zone, the second interface (P2) is connected with the first reference voltage (VDD), no current passes through an electrode connected with the third zone, and the third zone may not emit light, thereby ensuring the pixel to have high color purity. Because the vapor plating mask generally deflects leftward or rightward during alignment, color mixing occurs in at most one zone of the first zone or the third zone, thereby increasing an aperture ratio of the pixel of the OLED panel.

The significantly increase the pixel aperture ratio of the OLED panel, the distance (D1) between the second zone and the first zone of the colored light emitting zone of the same color, and the distance (D1) the second zone and the third zone of the colored light emitting zone of the same color are reduced. As the distance D1 between the second zone and the first zone of the colored light emitting zone of the same color, or the distance D1 the second zone and the third zone of the colored light emitting zone of the same color becomes small, the aperture ratio of the pixel of the OLED panel is increased. However, the distance D1 cannot be zero. In a prior art, a minimum size of the distance D1 may be 3 μm. Considering, accuracy and quality of an equipment, the minimum size of the distance D1 need be 3 μm≤D1≤5 μm. Similarly, the distance between two adjacent colored light emitting zones of different colors is D2, a size of the distance D2 is 5 μm≤D2≤10 μm. Both a width of the first zone and a width of the third zone are H, 5 μm≤H≤9.5 μm.

Suppose D1=3 μm and D2=5 μm, and the distance D0 between the light emitting zones of different colors is 30 μm in the prior art, the width of 9.5 μm of the first zone and the width of the third zone may be obtained, a specific calculation method is as follows: H=(D0−2*D1−D2)/2, which is an area of the light emitting zone newly added on a basis of the prior art.

Suppose D1=5 μm and D2=10 μm, and the distance D0 between the light emitting zones of different colors is 30 μm in the prior art, the width of 5 μm of the first zone and the width of the third zone may be obtained, which is the area of the light emitting zone newly added on the basis of the prior art.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong, to the protection scope of the present disclosure.

I claim:

1. An organic light emitting diode (OLED) panel, comprising:
   a substrate;
   a pixel deposited on the substrate by a vapor plating method; and
   a multiplexer;
   wherein the pixel comprise a plurality of colored light emitting zones arranged in parallel from each other; each of the colored light emitting zones is divided into a second zone, a first zone, and a third zone; a distance is set between the second zone and the first zone, and a distance is set between the second zone and the third zone; anodes of the first zone, the second zone, and the third zone are connected with a first reference voltage by a thin film transistor (TFT), a cathode of the first zone is connected to a first interface, a cathode of the second zone is connected to a second reference voltage different from the first reference voltage, and a cathode of the third zone is connected to a second interface;
   wherein when color mixing occurs in the first zone, the first interface is connected with the first reference voltage to eliminate, and when there is no color mixing in the first zone, the first interface is connected with the second reference voltage; when color mixing occurs in the third zone, the second interface is connected with the first reference voltage, and when there is no color mixing in the third zone, the second interface is connected with the second reference voltage;
   wherein the first interface and the second interface are selectively connected with the first reference voltage or the second reference voltage by the multiplexer, a distance between the second zone and the first zone is D1 and the distance between the second zone and the third zone is also D1, D1=3 μm, and a distance between two adjacent colored light emitting zones of different colors is D2, D2=5 μm.

2. An organic light emitting diode (OLED) panel, comprising:
   a substrate; and
   a pixel deposited on the substrate by a vapor plating method;
   wherein the pixel comprise a plurality of colored light emitting zones arranged in parallel from each other; each of the colored light emitting zones is divided into a second zone, a first zone, and a third zone; a distance is set between the second zone and the first zone, and a distance is set between the second zone and the third zone; anodes of the first zone, the second zone, and the third zone are connected with a first reference voltage by a thin film transistor (TFT), a cathode of the first zone is connected to a first interface, a cathode of the second zone is connected to a second reference voltage different from the first reference voltage, and a cathode of the third zone is connected to a second interface;
   wherein when color mixing occurs in the first zone, the first interface is connected with the first reference voltage, and when there is no color mixing in the first zone, the first interface is connected with the second reference voltage; when color mixing occurs in the third zone, the second interface is connected with the first reference voltage, and when there is no color mixing in the third zone, the second interface is connected with the second reference voltage, wherein the OLED panel further comprises a multiplexer; the first interface and the second interface are selectively connected with the first reference voltage or the second reference voltage by the multiplexer.

3. The organic light emitting diode (OLED) panel of claim 2, wherein a width of the first zone is H and a width of the third zone is also H, 5 μm≤H≤9.5 μm.

4. The organic light emitting diode (OLED) panel of claim 2, wherein a distance between the second zone and the first zone is D1 and the distance between the second zone and the third zone is also D1, 3 μm≤D1≤5 μm.

5. The organic light emitting diode (OLED) panel of claim 2, wherein a distance between two adjacent colored light emitting zones of different colors is D2, 5 μm≤D2≤10 μm.

6. The organic light emitting diode (OLED) panel of claim 2, wherein a distance between the second zone and the first zone is D1 and the distance between the second zone and the third zone is also D1, D1=3 μm, and a distance between two adjacent colored light emitting zones of different colors is D2, D2=5 μm.

* * * * *